United States Patent
Hsieh et al.

(10) Patent No.: US 11,969,752 B2
(45) Date of Patent: Apr. 30, 2024

(54) ORGANIC POLYMER FILM AND MANUFACTURING METHOD THEREOF

(71) Applicant: FENG CHIA UNIVERSITY, Taichung (TW)

(72) Inventors: Ping-Yen Hsieh, Tainan (TW);
Xuan-Xuan Chang, Taichung (TW);
Ying-Hung Chen, Taichung (TW);
Chu-Liang Ho, Taichung (TW)

(73) Assignee: FENG CHIA UNIVERSITY, Taichung (TW)

( * ) Notice: Subject to any disclaimer, the term of this patent is extended or adjusted under 35 U.S.C. 154(b) by 63 days.

(21) Appl. No.: 17/555,289

(22) Filed: Dec. 17, 2021

(65) Prior Publication Data
US 2022/0193719 A1    Jun. 23, 2022

(30) Foreign Application Priority Data
Dec. 19, 2020 (TW) ................. 109145193

(51) Int. Cl.
*B05D 1/00* (2006.01)
*C08G 61/02* (2006.01)
*H01J 37/32* (2006.01)

(52) U.S. Cl.
CPC ............ *B05D 1/62* (2013.01); *C08G 61/025* (2013.01); *H01J 37/32027* (2013.01); *H01J 37/32137* (2013.01); *H01J 37/32449* (2013.01); *H01J 37/32568* (2013.01); *B05D 2201/02* (2013.01); *B05D 2202/00* (2013.01); *B05D 2518/00* (2013.01); *C08G 2261/1412* (2013.01); *C08G 2261/44* (2013.01)

(58) Field of Classification Search
CPC ...................................................... B05D 1/62
See application file for complete search history.

(56) References Cited

U.S. PATENT DOCUMENTS

| 4,693,799 A * | 9/1987 | Yanagihara ............... B05D 1/62 |
| | | 428/835.2 |
| 2004/0202880 A1* | 10/2004 | Winther-Jensen ...... C08G 61/02 |
| | | 428/500 |

FOREIGN PATENT DOCUMENTS

JP    2015-521338 A    7/2015

OTHER PUBLICATIONS

PubChem. O-Xylene Compound Summary. 2023. (Year: 2023).*
PubChem. P-Xylene Compound Summary. 2023. (Year: 2023).*

* cited by examiner

*Primary Examiner* — Dah-Wei D. Yuan
*Assistant Examiner* — Kristen A Dagenais
(74) *Attorney, Agent, or Firm* — Cheng-Ju Chiang

(57) ABSTRACT

The present invention discloses an organic polymer film and a manufacturing method thereof. The organic polymer film is mainly manufactured by the following steps. Firstly, the step (A) provides a xylene precursor and a substrate, and the step (B) places the substrate inside of a plasma equipment. After that, the step (C) evacuates the plasma equipment while introducing a carrier gas which carries vapor of the xylene precursor, and the step (D) turns on a pulse power supply system of the plasma equipment, generating a short pulse for plasma ignition. Finally, the step (E) forms the organic polymer film on the substrate. In the aforementioned steps, the frequency of the short pulse plasma is between 1 Hz~10,000 Hz, and the pulse period of the short pulse plasma is between 1 μs~60 μs.

8 Claims, 2 Drawing Sheets

ORGANIC POLYMER FILM AND MANUFACTURING METHOD THEREOF

TECHNICAL FIELD

The present invention is specifically related to an organic polymer film and manufacturing method thereof. Specifically, the organic polymer film and manufacturing method are implemented by a polymerizable precursor which is manufactured by short pulse plasma with specific frequency. Therefore, the organic polymer film mentioned in the present invention is an organic plasma polymer film.

BACKGROUND OF RELATED ARTS

The known "plasma-polymerized" or "plasma polymer" films that prepared by plasma polymerization have been found with characteristics covering a wide range of properties including high chemical inertness, transparency, good biocompatibility, cytotoxicity-free, high water/gas barrier and lubricity. Therefore, these films have been widely used in medical equipment, aerospace, and electronics industries.

In fact, the aforementioned plasma polymer film can be organic-like or inorganic-like, depending on the glow discharge plasma parameters where they can greatly affect the plasma polymerization reaction and eventually the characteristics of the obtained film.

The mechanism of the plasma polymerization reaction is associated by an electric field applied under low-pressure condition with the admitted precursor forming a glow discharge plasma, where the high-energy electrons within the plasma collide with the precursor gas molecules to undergo excitation, dissociation, and ionization. Such plasma activated precursor gaseous state can form very different film structure. For the extreme cases, it can be inorganic compound film or organic-like structure.

The common main feature of the aforementioned manufacturing method is that the obtained film performs uniform and pinhole-free characteristics in a microscopic size. In addition, the process temperature during reaction can be near room temperature. On the other hand, the film composition is controllable, therefore the type of precursors for choosing are less restricted and flexible. The growth rate of the film is satisfactory in most cases of application.

However, the plasma polymerization reaction, when activated by using conventional plasma power supply, such as direct current (DC), pulsed-DC, radio frequency (RF) and pulsed RF, the plasma discharge is continuously activated or at least intermittently activated with its output pulses too long; as a result, the plasma associated with high discharge energy will cause considerable fragmentation to the precursor molecular structure and generate the well-known 3D network structure in the obtained plasma polymer film.

In the development history of plasma polymerization, these 3D network structures were new to people and have been created a large number of applications. On the other hand, these plasma polymerization methods by using conventional power supply are helpless in developing thin polymer coatings with their molecular structure similar to conventional polymer chain, which bare intrinsically physical and chemical properties, i.e. resilience, hydrophobicity and biocompatibility, etc. Therefore, a new manufacturing method is urgently needed to improve such problems.

SUMMARY

The purpose of the present invention is to solve the problems mentioned in background of related arts. Therefore, the present invention discloses an organic polymer film and a manufacturing method thereof. The organic polymer film is mainly manufactured by the following steps. Firstly, the step (A) provides a xylene precursor and a substrate, and the step (B) places the substrate inside of a plasma equipment. After that, the step (C) evacuates the plasma equipment while introducing a carrier gas which carries vapor of the xylene precursor, and the step (D) turns on a pulse power supply system of the plasma equipment, generating a short pulse for plasma ignition. Finally, the step (E) forms the organic polymer film on the substrate. In the aforementioned steps, the frequency of the short pulse plasma is between 1 Hz~10,000 Hz, and the pulse period of the short pulse plasma is between 1 μs~60 μs.

Embodiments of the invention are illustrated by way of example, and not by way of limitation, in the figures of the accompanying drawings in which like reference numerals refer to similar elements.

DETAILED DESCRIPTION OF THE INVENTION

In order to understand the technical features and functions of the present invention in detail and do implement according to the content of the invention. The specific embodiments disclosed in the figures are further described in detail as follows.

Figure 1:
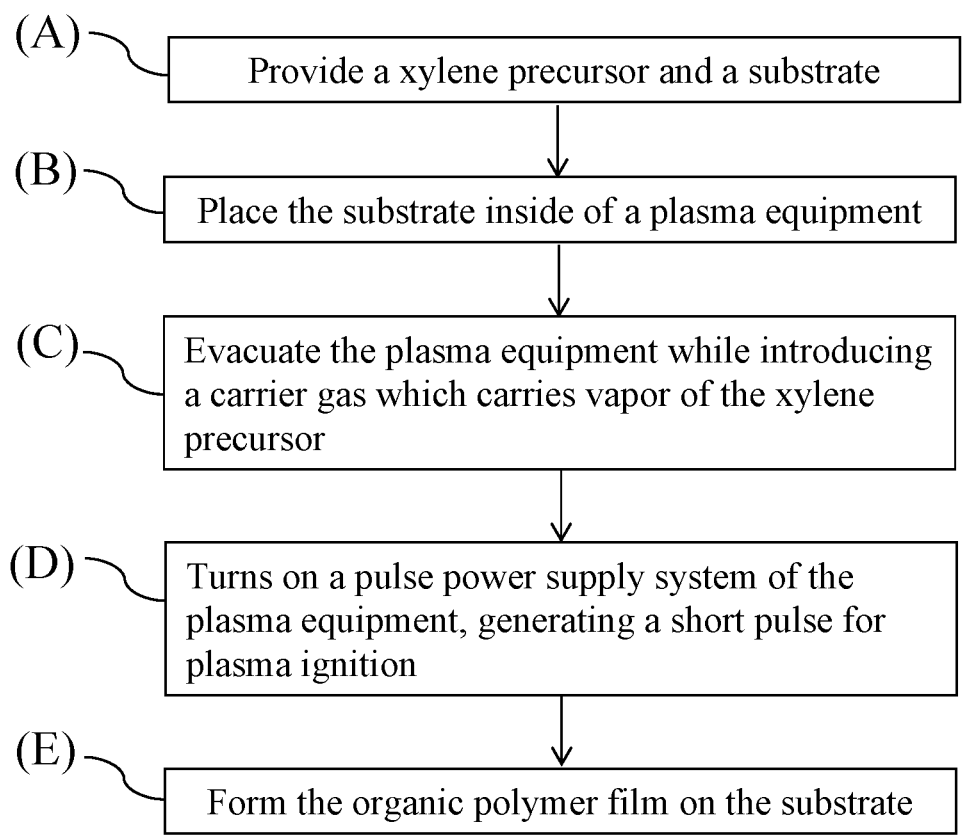
FIG. 1 is a flowchart of the manufacturing method of the organic polymer film of the embodiments of the present invention.
Figure 2:
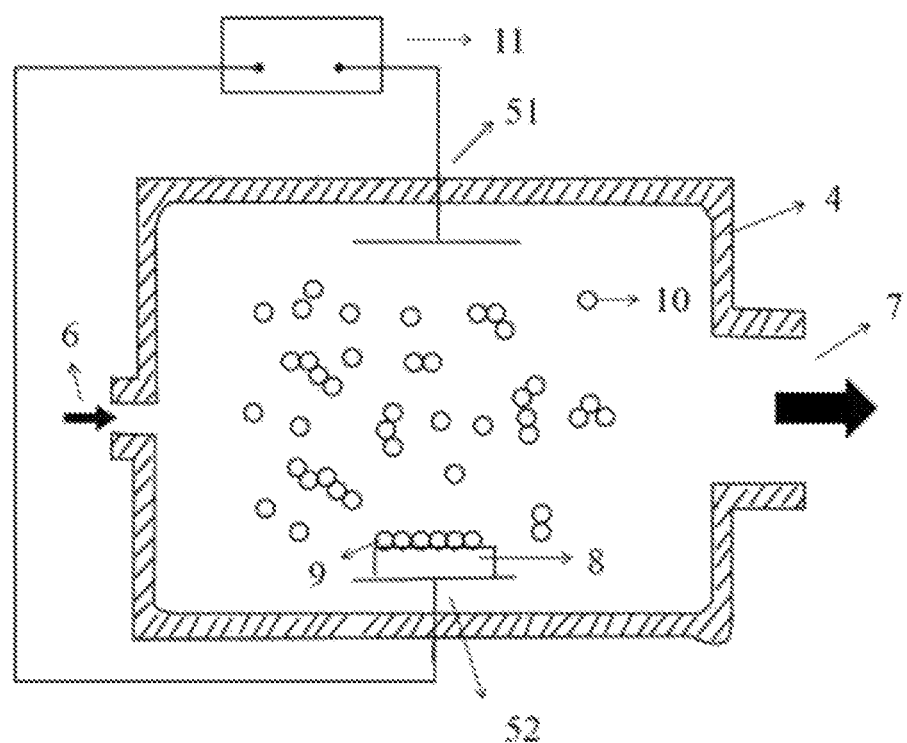
FIG. 2 is a schematic diagram of the operation of the plasma equipment of the embodiment of the present invention.

Please refer to FIG. 1 and FIG. 2. FIG. 1 is a flowchart of the manufacturing method of the organic polymer film of the embodiments of the present invention. FIG. 2 is a schematic diagram of the operation of the plasma equipment of the embodiment of the present invention.

To manufacture the organic polymer film of the present embodiment, the step (A) will be executed firstly. The step (A) of the present embodiment provides a xylene precursor and a substrate. In the present embodiment, the xylene precursor 10 is in liquid form before entering the chamber 4. Before the manufacturing process of the organic polymer film 9, increasing the temperature or decreasing the pressure (such as vacuuming chamber 4 to form a decompression environment) of xylene precursor 10 is executed therefore to form a vapor which is composed of xylene precursor 10. The vapor of xylene precursor 10 will be introduced into the chamber 4. In this embodiment, the material of substrate 8 is polymer or metal. When the material of substrate 8 is polymer, the polymer may be silicone, rubber, polyethylene, polyetheretherketone (PEEK), polyurethane or the combination thereof. On the other hand, if the substrate 8 is metal, the material of substrate 8 is selected form the group consisting of stainless steel, titanium, aluminum or alloys and oxides per se. The present invention is not limited thereto.

Furthermore, the xylene precursor 10 may be selected from a group consisting of 1,2-Dimethylbenzene, 1,3-Dimethylbenzene and 1,4-Dimethylbenzene. When 1,4-Dimethylbenzene is selected as the xylene precursor 10, a relatively excellent organic polymer film 9 can be manufactured.

In another possible embodiment, the xylene precursor 10 may be selected from a group consisting of 1,2-Bis(trifluoromethyl)benzene, 1,3-Bis(trifluoromethyl)benzene and 1,4-Bis(trifluoromethyl)benzene. When 1,4-Bis(trifluoromethyl)benzene is selected as the xylene precursor 10, a relatively excellent organic polymer film 9 can be manufactured.

After that, the step (B) places the substrate inside of a plasma equipment. The configuration of the plasma equipment mentioned in step (B) is illustrated in FIG. 2. Specifically, the plasma equipment of the present embodiment is constructed by chamber 4-gas inlet 6-gas outlet 7 and pulse power supply system 11. The gas inlet 6 and the gas outlet 7 are connected to the chamber 4, and the pulse power supply system 11 includes upper electrode 51 and lower electrode 52. The pulse power supply system 11 is built and selected for generating plasma in this embodiment. The plasma works in short pulse forms. The short pulse form means the short pulse plasma with the low duty cycle (specifically, the low pulse frequency, short pulse period and long off time), therefore, to implement the manufacturing of the organic polymer film 9 of the present embodiment. On the other hand, the upper electrode 51 and the lower electrode 52 are configured inside the chamber 4. The substrate 8 is placed onto the lower electrode 52.

Thereafter, the step (C) evacuates the plasma equipment while introducing a carrier gas which carries vapor of the xylene precursor. As mentioned in the step (A), when the xylene precursor 10 is introduced into the decompression environment (the gas outlet 7 pumps the chamber 4, and the pressure of the decompression environment of the present embodiment ranges from 10 Torr to $10^{-2}$ Torr, or the better 10 Torr to $10^1$ Torr). Thus, the vapor of the xylene precursor 10 enters the chamber 4 via gas inlet 6. In the present embodiment, the vapor of xylene precursor 10 is carried by a carrier gas (the flow rate is less than 1000 sccm or better ranges from 100 sccm to 200 sccm) and enters the chamber 4. The carrier gas of this embodiment is Ar.

The step (D) is then executed. In step (D), it turns on pulse power supply system 11 of plasma equipment, generating a short pulse for plasma ignition. Finally, the step (E) is to form the organic polymer film on the substrate. In this embodiment, the organic polymer film 9 which is formed on substrate 8 can be manufactured by using adjustable short pulse forms to generate plasma in combination with different type of the xylene precursors 10. In other words, the short pulse plasma of the present invention is generated by a plasma power which is controlled by specific pulse power output form and it per se performs specific pulse waveform with each pulse at very short period of time at low frequency.

Specifically, the frequency of the short pulse plasma of the present embodiment is between 1 Hz~10,000 Hz, and the pulse period of the short pulse output is between 1 μs~60 μs. On the other hand, the average power to generate the short pulse plasma can only be 50 W.

When the xylene precursor 10 is selected from 1,4-Dimethylbenzene, the average power to generate the short pulse plasma is 50 W, and the optimal frequency of the short pulse plasma is 1,000 Hz. When the xylene precursor 10 is selected from 1,4-Bis(trifluoromethyl)benzene, the average power to generate the short pulse plasma is 50 W, and the optimal frequency of the short pulse plasma is 1,000 Hz. However, the pulse period of the short pulse plasma is changed to 20 μs.

The 1,4-Dimethylbenzene which is used as xylene precursor 10 for manufacturing the organic polymer film 9 performs marvelous hydrophobicity, low friction coefficient, anti-sticking property, and high biocompatibility. Furthermore, when the 1,4-Bis(trifluoromethyl)benzene is selected as the xylene precursor 10 for manufacturing the organic polymer film 9, this organic polymer film 9 performs better hydrophobicity and lower friction coefficient than the organic polymer film 9 which is manufactured via the 1,4-Dimethylbenzene.

As understood by a person skilled in the art, the foregoing preferred embodiments of the present invention are illustrated of the present invention rather than limiting of the present invention. It is intended to cover various modifications and similar arrangements comprised within the spirit and scope of the appended claims, the scope of which should be accorded the broadest interpretation so as to encompass all such modifications and similar structure. While the preferred embodiment of the invention has been illustrated and described, it will be appreciated that various changes can be made therein without departing from the spirit and scope of the invention.

What is claimed is:

1. A manufacturing method of an organic polymer film, comprising:
    (A) providing a xylene precursor and a substrate;
    (B) placing the substrate inside of a plasma equipment;
    (C) evacuating the plasma equipment while introducing a carrier gas which carries vapor of the xylene precursor;
    (D) turning on a pulse power supply system of the plasma equipment, generating a short pulse for plasma ignition; and
    (E) forming the organic polymer film on the substrate;
    wherein frequency of the short pulse plasma is between 1 Hz-10,000 Hz;
    wherein pulse period of the short pulse plasma is between 1 μs and 60 μs;
    wherein the xylene precursor is selected from the group consisting of the 1,2-Bis(trifluoromethyl)benzene, 1,3-Bis(trifluoromethyl)benzene, and 1,4-Bis(trifluoromethyl)benzene.

2. The manufacturing method of the organic polymer film as claimed in claim 1, wherein the substrate is polymer material or metal.

3. The manufacturing method of the organic polymer film as claimed in claim 1, wherein the plasma equipment of the step (B) comprises:
    a chamber;
    a gas inlet, connected with the chamber;
    a gas outlet, connected with the chamber; and
    wherein the pulse power supply system comprises:
    an upper electrode and a lower electrode;
    wherein the upper electrode and the lower electrode are configured inside the chamber;
    wherein the substrate is placed onto the lower electrode.

4. The manufacturing method of the organic polymer film as claimed in claim 1, wherein the carrier gas is Ar.

5. The manufacturing method of the organic polymer film as claimed in claim 1, wherein the frequency of the short pulse plasma is 1,000 Hz.

6. The manufacturing method of the organic polymer film as claimed in claim 1, wherein the xylene precursor is the 1,4-Bis(trifluoromethyl)benzene.

7. The manufacturing method of the organic polymer film as claimed in claim 6, wherein the pulse period of the short pulse plasma is 20 μs.

8. The manufacturing method of the organic polymer film as claimed in claim 1, wherein power of the short pulse plasma is 50 W.

\* \* \* \* \*